United States Patent [19]

Araki

[11] Patent Number: 5,989,959
[45] Date of Patent: Nov. 23, 1999

[54] METHOD OF MANUFACTURING NONVOLATILE SEMICONDUCTOR MEMORY DEVICES WITH A REDUCED NUMBER OF GATE ELECTRODE FORMING STEPS

[75] Inventor: Yoshiko Araki, Yokkaichi, Japan

[73] Assignee: Kabushiki Kaisha Toshiba, Kawasaki, Japan

[21] Appl. No.: 08/992,509

[22] Filed: Dec. 17, 1997

[30] Foreign Application Priority Data

Dec. 26, 1996 [JP] Japan .................................. 8-347425

[51] Int. Cl.[6] .............................................. H01L 21/8247
[52] U.S. Cl. .................................. 438/258; 438/257
[58] Field of Search .................................. 438/257, 258, 438/262, 263, 266

[56] References Cited

U.S. PATENT DOCUMENTS

| | | | |
|---|---|---|---|
| 5,304,503 | 4/1994 | Yoon et al. | 437/43 |
| 5,439,838 | 8/1995 | Yang | 437/43 |
| 5,445,981 | 8/1995 | Lee | 437/43 |
| 5,635,416 | 6/1997 | Chen et al. | 438/258 |
| 5,756,385 | 5/1998 | Yuan et al. | 438/258 |

*Primary Examiner*—Olik Chaudhuri
*Assistant Examiner*—Daniel H. Mao
*Attorney, Agent, or Firm*—Banner & Witcoff, Ltd.

[57] ABSTRACT

A silicon nitride film and a silicon oxide film are deposited in that order on a WSi film. In a single session of lithography, the gate electrode of a memory cell and the gate electrode of a transistor constituting a peripheral circuit are formed. The silicon oxide film makes a mask used to form a floating gate of the memory cell. The silicon nitride film makes a mask used to form a common source region by etching a gate oxide film and a field oxide film. The silicon nitride film covers the WSi film to prevent impurities from entering the WSi film when impurities are introduced into the common source region. This prevents abnormal oxidation in a subsequent process.

23 Claims, 10 Drawing Sheets

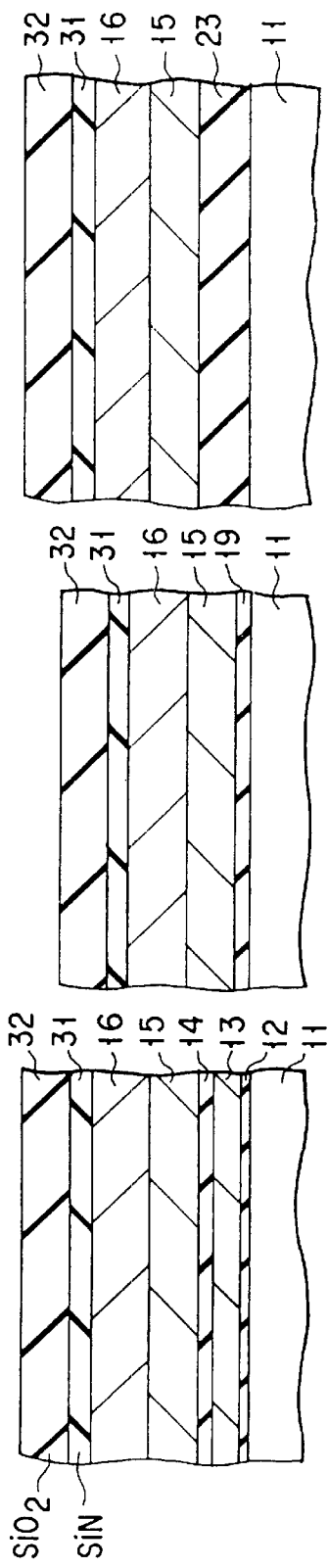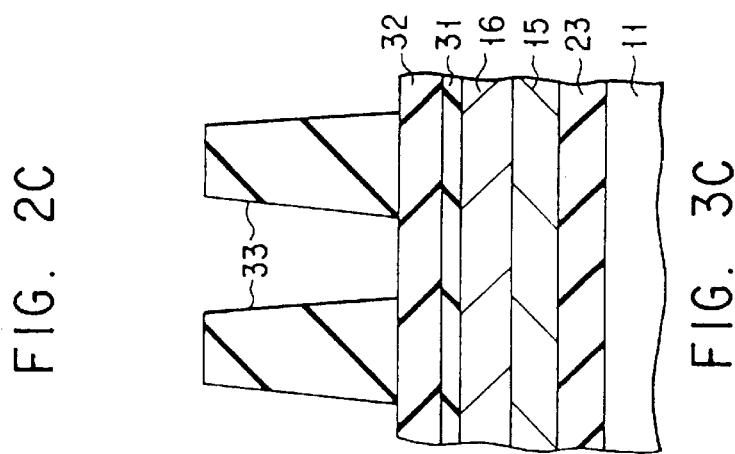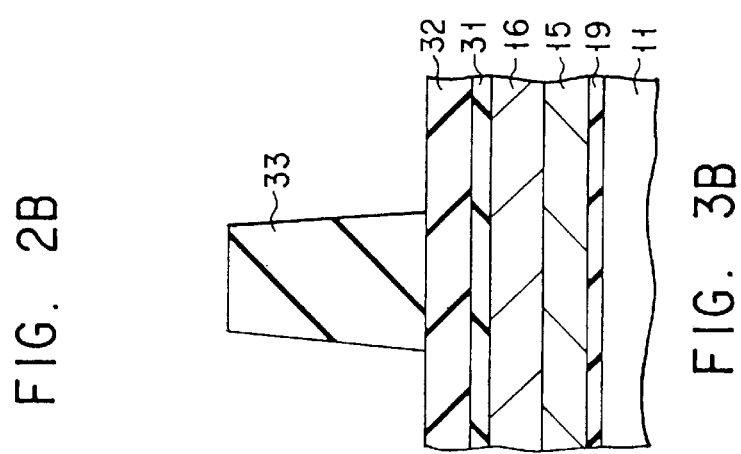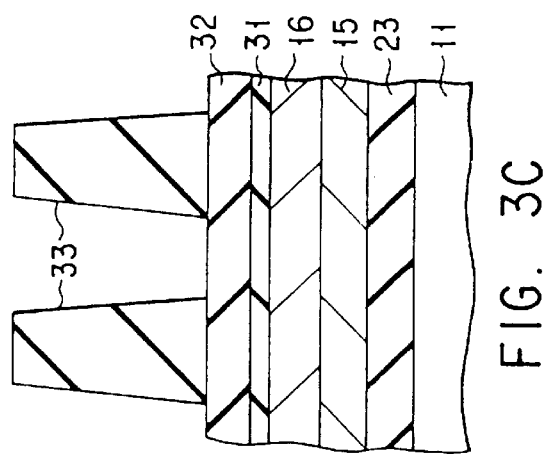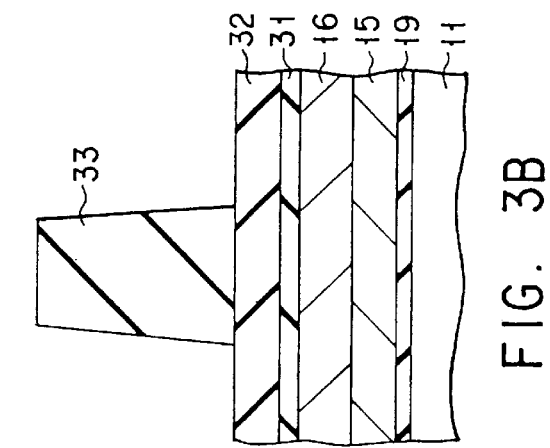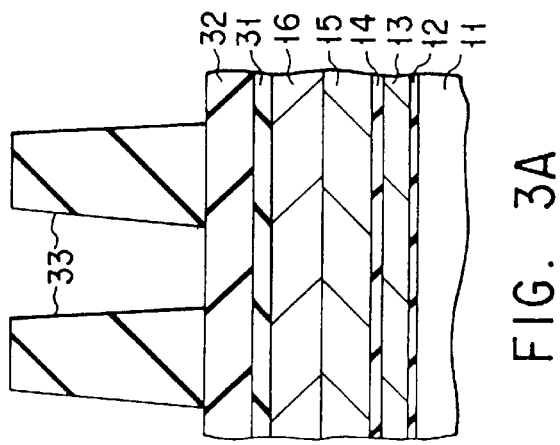

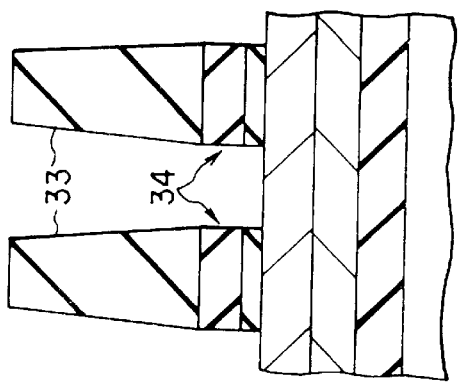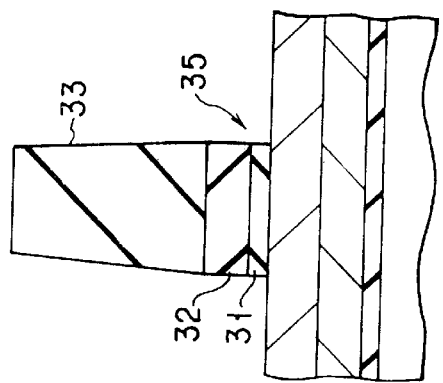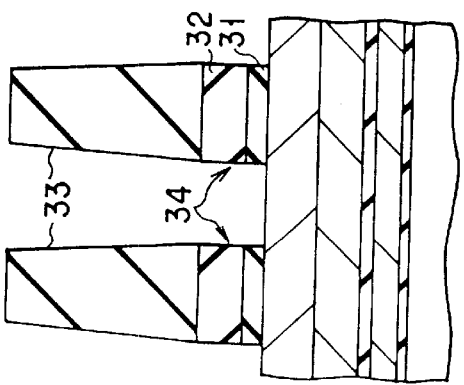
FIG. 4A  FIG. 4B  FIG. 4C
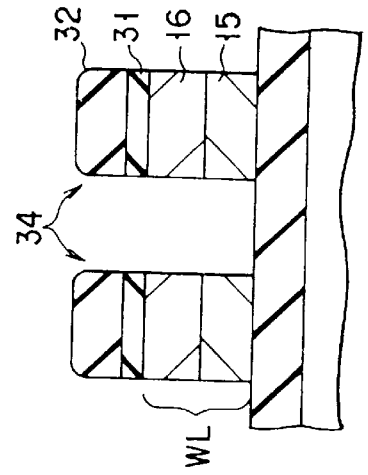
FIG. 5A  FIG. 5B  FIG. 5C

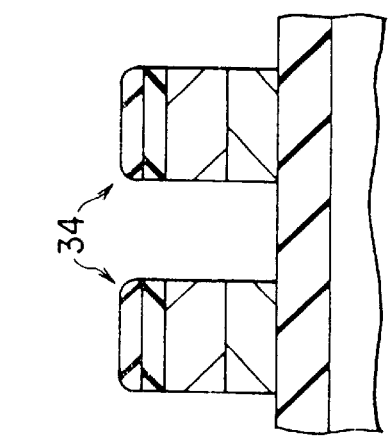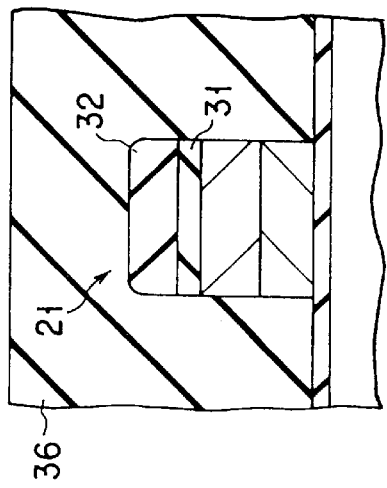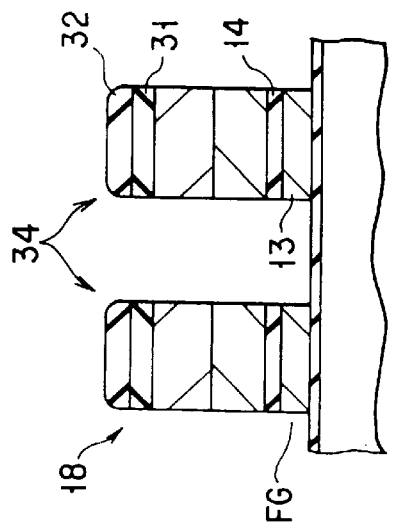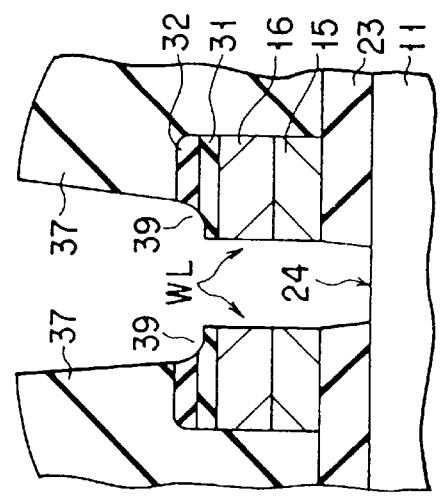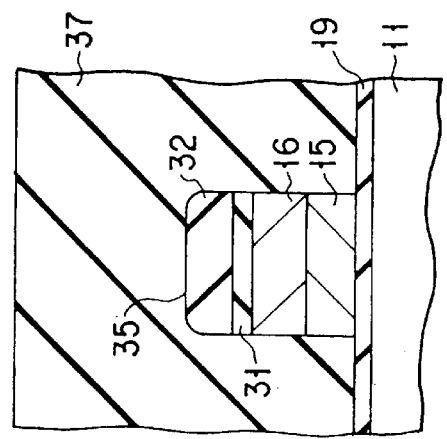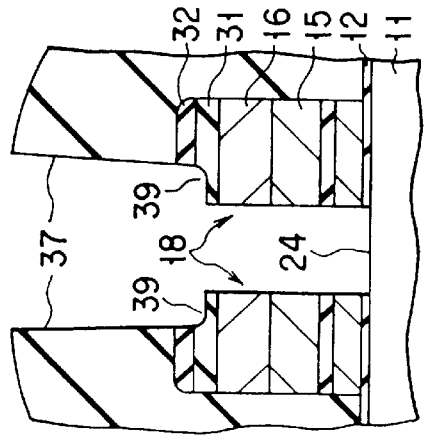

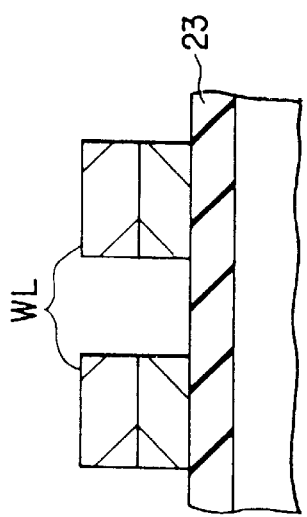
FIG. 15A
PRIOR ART
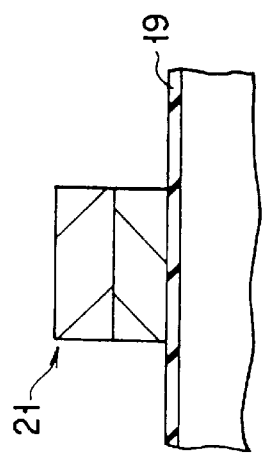
FIG. 15B
PRIOR ART
FIG. 15C
PRIOR ART
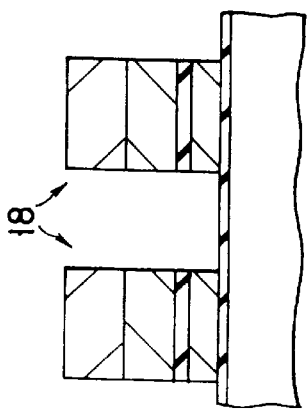
FIG. 16A
PRIOR ART
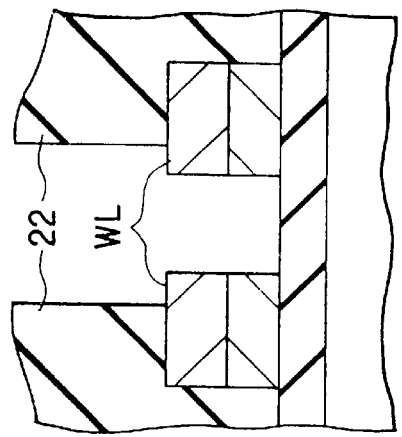
FIG. 16B
PRIOR ART
FIG. 16C
PRIOR ART
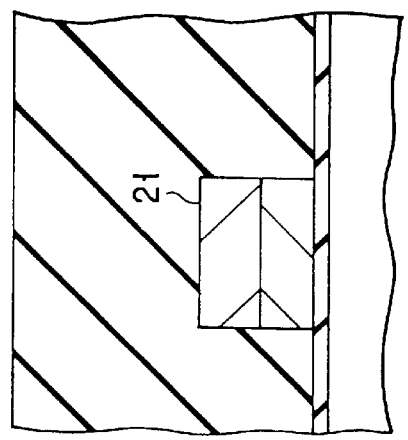
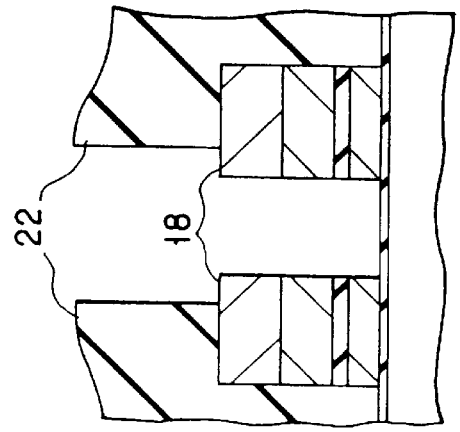

METHOD OF MANUFACTURING NONVOLATILE SEMICONDUCTOR MEMORY DEVICES WITH A REDUCED NUMBER OF GATE ELECTRODE FORMING STEPS

BACKGROUND OF THE INVENTION

This invention relates to a method of manufacturing stacked-gate nonvolatile semiconductor memory devices applied to flash memory or the like.

Generally, in a nonvolatile semiconductor memory device composed of an EEPROM, stacked-gate memory cells are formed using a first resist pattern as a mask. Thereafter, the first resist pattern is removed and then a second resist pattern is formed to produce a gate electrode for a peripheral circuit. Next, with the gate electrode of a memory cell array section as a mask, a field oxide film is etched away in such a manner that it is self-aligned to one end of the gate electrode to form a source interconnection region.

FIGS. 12A to 18C show a method of manufacturing conventional nonvolatile semiconductor memory devices, such as NOR flash memory. FIGS. 12A, 13A, 14A, 15A, 16A, 17A, and 18A each illustrate a memory cell section. FIGS. 12B, 13B, 14B, 15B, 16B, 17B, and 18B each represent a transistor constituting a peripheral circuit section. FIGS. 15C, 16C, 17C, and 18C each depict the structure of a field oxide film section.

First, as shown in FIG. 12A, a gate insulating film 12, a polysilicon film 13 making a floating gate, an ONO (oxide nitride oxide) insulating film 14, a polysilicon film 15 making a control gate, and a tungsten silicide film (WSi) 16 are stacked in that order on a semiconductor substrate 11 in a memory cell section. On the tungsten silicide film 16, a first resist 17 is formed, which is subjected to pattering.

Next, using the pattern of the first resist 17 as a mask, the tungsten silicide film 16, polysilicon film 15, ONO insulating film 14, and polysilicon film 13 are etched in that order to form a gate electrode 18 for the memory cell as shown in FIG. 13A.

At this time, the peripheral circuit section is constructed as shown in FIGS. 12B and 13B. Specifically, an insulating film 19, the polysilicon film 15 making a gate electrode, and the tungsten silicide film 16 are stacked in that order on the semiconductor substrate 11. The tungsten silicide film 16 is covered with the first resist 17.

After the first resist 17 has been peeled, a second resist 20 is formed all over the surface as shown in FIGS. 14A and 14B. Using the resist pattern as a mask, the tungsten silicide film 16 and polysilicon film 15 in the peripheral circuit section are etched in that order to form a gate electrode.

Then, removing the second resist 20 forms the gate electrode 21 of a transistor constituting the peripheral circuit section as shown in FIG. 15B. FIG. 15C shows word lines WL formed on the field oxide film 23. The word lines WL are formed integrally with the control gates constituting the memory cells.

Then, as shown in FIGS. 16A, 16B, and 16C, a third resist 22 is formed all over the surface. The third resist 22 is subjected to patterning so as to cover every other space between the gate electrodes 18 and every other space between the word lines WL and expose every other space between the gate electrodes 18 and every other space between the word lines WL.

Next, as shown in FIGS. 17A, 17B, and 17C, with the third resist 22 and the tungsten silicide film 16 of the gate electrode 18 as a mask, the gate insulating film 12 is etched in such a manner that the gate insulating film is self-aligned to the gate electrode 18. This forms a common source region 24. At the same time, using the word lines WL as a mask, the field oxide film 23 is etched to form the common source region 24.

Thereafter, the third resist 22 is removed and then a fourth resist 26 is formed as shown in FIGS. 18A, 18B, and 18C. With the fourth resist 26 as a mask, ions of n-type impurities, for example, arsenic (As), are implanted into the semiconductor substrate 11 to form a common source line 25.

The conventional manufacturing method requires two lithographic processes: the lithographic process of forming the gate electrode of the memory cell section and that of forming the gate electrode of the peripheral circuit section. In these lithographic processes, the dimensions are difficult to control. Furthermore, as the memory cells are made much finer, the space between adjacent gate electrodes gets much narrower. As a result, it is more difficult to etch the space between the gate electrodes with a resist mask.

During ion implantation to form the common source line, part of the gate electrode 18 constituting the memory cell section and part of the word lines are exposed at the fourth resist 26. This permits arsenic to enter the tungsten silicide film constituting the gate electrodes and word lines, which causes the problem of lessening the margin for abnormal oxidation of the tungsten silicide film in a subsequent oxidation process.

BRIEF SUMMARY OF THE INVENTION

The object of the present invention is to provide a method of manufacturing nonvolatile semiconductor memory devices that is capable of not only simplifying the process of manufacturing the gate electrodes but also assuring a margin for abnormal oxidation in a subsequent oxidation process.

The foregoing object is accomplished by providing a method of manufacturing nonvolatile semiconductor memory device, comprising steps of: forming a gate insulating film, a first polysilicon layer so as to make a first gate electrode of a two-layer gate-electrode memory cell, an insulating film on the first polysilicon layer, a second polysilicon layer and a metallic silicide layer so as to make a second gate electrode of said two-layer gate-electrode memory cell and a gate electrode of a transistor constituting part of a peripheral circuit, in that order on a semiconductor substrate; depositing a silicon nitride film and a silicon oxide film in that order above said metallic silicide layer; forming a resist pattern on said silicon oxide film, said resist pattern selectively covering a region where said second gate electrode and the gate electrode of said transistor are to be formed; etching said silicon oxide film and silicon nitride film with said resist pattern as a mask; etching said metallic silicide layer and second polysilicon layer with said silicon oxide film and silicon nitride film remaining above said metallic silicide layer as a mask to form said second gate electrode and the gate electrode of said transistor; etching said insulating film and first polysilicon layer with said silicon oxide film and silicon nitride film remaining above said second gate electrode as a mask to form said first gate electrode; etching said gate insulating film on said semiconductor substrate with said silicon oxide film and silicon nitride film remaining above said second gate electrode as a mask to form a common source region; and introducing impurities into said common source region with said silicon oxide film and silicon nitride film remaining above said second gate electrode as a mask to form a common source line.

The foregoing object is also accomplished by providing a method of manufacturing nonvolatile semiconductor memory device, comprising steps of: forming a field oxide film and a gate insulating film on a semiconductor substrate; forming on said gate insulating film a first polysilicon layer so a to make a first gate electrode of a two-layer gate-electrode memory cell, forming an insulating film on the first polysilicon layer, and forming a second polysilicon layer and a metallic silicide layer in that order on said insulating film, said gate insulating film, and said field oxide film, said second polysilicon layer and metallic silicide layer being formed so as to make a second gate electrode of the two-layer gate-electrode memory cell, a gate electrode of a transistor constituting part of a peripheral circuit, and a word line; depositing a silicon nitride film and a silicon oxide film above said metallic silicide layer; forming a resist pattern on said silicon oxide film, said resist pattern selectively covers a region where said second gate electrode, the gate electrode of said transistor, and said word line are to be formed; etching said silicon oxide film and silicon nitride film with said resist pattern as a mask; etching said metallic silicide layer and second polysilicon layer with said silicon oxide film and silicon nitride film remaining above said metallic silicide layer as a mask to form said second gate electrode, the gate electrode of said transistor, and said word line at the same time; etching said insulating film and first polysilicon layer with said silicon oxide film and silicon nitride film remaining above said second gate electrode as a mask to form said first gate electrode; etching the gate insulating film on said semiconductor substrate with said silicon oxide film and silicon nitride film remaining above said second gate electrode as a mask to form common source region; and introducing impurities into said common source region with said silicon oxide film and silicon nitride film remaining above said second gate electrode as a mask to form a common source line.

With the present invention, the second gate electrode of a memory cell and the gate electrode of a transistor constituting the peripheral circuit are formed at the same time, which simplifies the process of producing these gate electrodes. Furthermore, when impurities are introduced into the common source, the metallic silicide layer covered with a silicon nitride film prevents impurities from being introduced into the metallic silicide layer. This prevents abnormal oxide in a subsequent oxidation process.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 2A, 2B, and 2C show the manufacturing processes according to the present invention: FIG. 2A is a sectional view of the memory cell section taken along line A—A of FIG. 1; FIG. 2B is a sectional view of the peripheral circuit section; and FIG. 2C is a sectional view of the field oxide film section taken along line C—C of FIG. 1;

FIG. 3A is a sectional view to help explain the manufacturing step following that of FIG. 2A, FIG. 3B is a sectional view to help explain the manufacturing step following that of FIG. 2B, and FIG. 3C is a sectional view to help explain the manufacturing step following that of FIG. 2C;

FIG. 4A is a sectional view to help explain the manufacturing step following that of FIG. 3A, FIG. 4B is a sectional view to help explain the manufacturing step following that of FIG. 3B, and FIG. 4C is a sectional view to help explain the manufacturing step following that of FIG. 3C;

FIG. 5A is a sectional view to help explain the manufacturing step following that of FIG. 4A, FIG. 5B is a sectional view to help explain the manufacturing step following that of FIG. 4B, and FIG. 5C is a sectional view to help explain the manufacturing step following that of FIG. 4C;

FIG. 6A is a sectional view to help explain the manufacturing step following that of FIG. 5A, FIG. 6B is a sectional view to help explain the manufacturing step following that of FIG. 5B, and FIG. 6C is a sectional view to help explain the manufacturing step following that of FIG. 5C;

FIG. 7A is a sectional view to help explain the manufacturing step following that of FIG. 6A, FIG. 7B is a sectional view to help explain the manufacturing step following that of FIG. 6B, and FIG. 7C is a sectional view to help explain the manufacturing step following that of FIG. 6C;

FIG. 12A is a sectional view of the memory cell section and FIG. 12B is a sectional view of the peripheral circuit section;

FIG. 15A is a sectional view to help explain the step of manufacturing the memory cell section following that of FIG. 14A, FIG. 15B is a sectional view to help explain the step of manufacturing the peripheral circuit section following that of FIG. 14B, and FIG. 15C is a sectional view of the field oxide film section;

FIG. 16A is a sectional view to help explain the manufacturing step following that of FIG. 15A, FIG. 16B is a sectional view to help explain the manufacturing step following that of FIG. 15B, and FIG. 16C is a sectional view to help explain the manufacturing step following that of FIG. 15C;

FIG. 19A is a sectional view of the memory cell section, FIG. 19B is a sectional view of the peripheral circuit section, and FIG. 19C is a sectional view of the field oxide film section.

DETAILED DESCRIPTION OF THE INVENTION

Hereinafter, referring to the accompanying drawings, embodiments of the present invention will be explained. In FIG. 1 to FIG. 11, the same parts as those in FIG. 12 to FIG. 18 are indicated by the same reference symbols.

Figure 1:
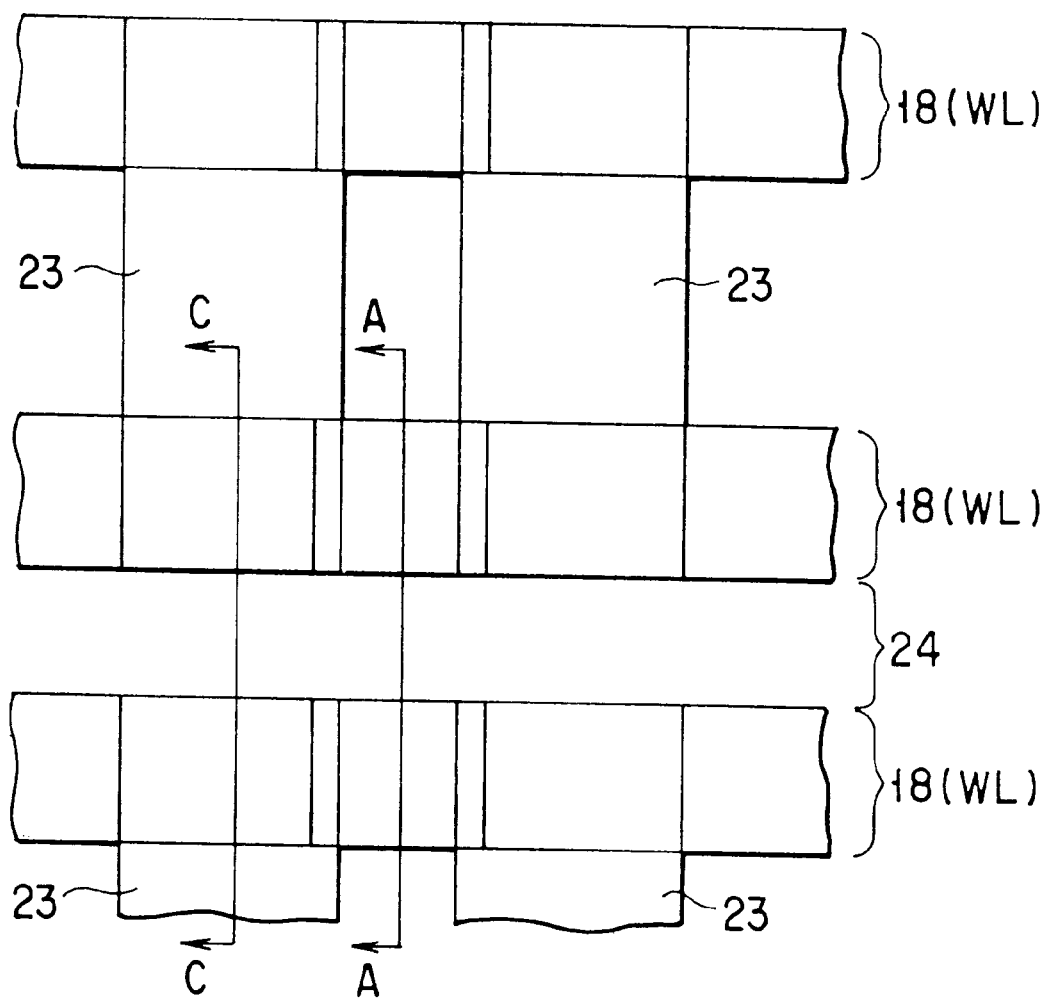
FIG. 1 is a plan view of a NOR flash memory according to a first embodiment of the present invention.

FIG. 1 is a plan view of a nonvolatile semiconductor memory device, such as a NOR flash memory. In FIG. 2 to FIG. 11, FIGS. 2A, 3A, 4A, 5A, 6A, 7A, 8A, 9A, 10A, and 11A are sectional views of the memory cell section taken along line A—A of FIG. 1. FIGS. 2B, 3B, 4B, 5B, 6B, 7B, 8B, 9B, 10B, and 11B each show a transistor constituting the peripheral circuit section. FIGS. 2C, 3C, 4C, 5C, 6C, 7C, 8C, 9C, 10C, and 11C are sectional views of the field oxide film section taken along line C—C of FIG. 1.

In FIG. 1, the gate electrodes 18 (including word lines WL) of memory cells are formed in parallel with each other on a semiconductor substrate. A common source region 24 is provided between the gate electrodes 18. Field oxide films 23 are formed so as to cross the gate electrodes 18 at right angles on the semiconductor substrate.

Referring to FIG. 2 to FIG. 11, a method of manufacturing the aforementioned nonvolatile semiconductor memory devices will be explained.

As shown in FIG. 2A, a gate insulating film 12, a polysilicon film 13 making a floating gate, an ONO (oxide nitride oxide) insulating film 14, a polysilicon film 15 making a control gate, and a refractory metallic silicide film, for example, a tungsten silicide film (hereinafter, referred to as a WSi film) 16, are stacked in that order on the semiconductor substrate 11 in the memory cell section. On the WSi film 16, a silicon nitride film (SiN) 31 is deposited. On the silicon nitride film 31, a silicon oxide film (SiO$_2$) 32 is deposited. The silicon nitride film 31 is thick enough to remain after the field oxide film has been etched away to form a common source region explained later. Specifically, the thickness of the silicon nitride film 31 is set at, for example, 1500 Å (angstroms). The silicon oxide film 32 is thick enough to remain after the WSi film 16, polysilicon film 15, ONO insulating film 14, and polysilicon film 13 have been etched away to form a gate electrode explained later. Specifically, the thickness of the silicon oxide film 32 is set at, for example, 3000 Å.

At this time, the peripheral circuit section is constructed as shown in FIG. 2B. Specifically, a gate insulating film 19, the polysilicon film 15 making a gate electrode, and the tungsten silicide film 16 are stacked in that order on the semiconductor substrate 11. On the tungsten silicide film 16, the silicon nitride film 31 and silicon oxide film 32 are formed in that order. In other words, in the peripheral circuit section, before the formation of the polysilicon film 15, the polysilicon film 13 making a floating gate is removed beforehand from the surface of the substrate in the memory cell section and thereafter a gate insulating film 19 is formed on the surface of the substrate.

The field oxide film section is constructed as shown in FIG. 2C. Specifically, the field oxide film 23 is formed on the semiconductor substrate 11. On the field oxide film 23, the polysilicon film 15 and tungsten silicide film 16 are stacked in that order. On the tungsten silicide film 16, the silicon nitride film 31 and silicon oxide film 32 are formed in that order. Specifically, before the formation of the polysilicon film 15, a slit-like space is provided in the region of the polysilicon film 13 corresponding to the field oxide film 23.

Next, as shown in FIGS. 3A, 3B, and 3C, on the silicon oxide film 32, a first resist 33 is formed, which is then subjected to patterning. Using the resist pattern as a mask, the silicon oxide film 32 and silicon nitride film 31 are etched in that order. Thus, as shown in FIGS. 4A, 4B, and 4C, the silicon oxide film 32 and silicon nitride film 31 produce mask patterns 34 and 35 to form the gate electrode of the memory cell section, the word lines of the field oxide film section, and the gate electrode constituting the transistor in the peripheral circuit section.

Next, after the first resist 33 has been removed, the WSi film 16 and polysilicon film 15 are etched with the mask patterns 34, 35 as a mask to form the control gate electrode CG of a memory cell, the word lines WL, and the gate electrode G constituting the transistor in the peripheral circuit section as shown in FIGS. 5A, 5B, and 5C. At this time, the silicon oxide film 32 acting as a mask is somewhat etched away and gets thinner a little.

Thereafter, as shown in FIG. 6B, a second resist 36 is formed so as to cover the peripheral circuit section. Using the second resist 36 and the patterned mask 34 as a mask, the ONO insulating film 14 and polysilicon film 13 are etched to produce a floating gate FG for a memory cell. At this time, the silicon oxide film 32 constituting the mask 34 is somewhat etched away and gets thinner a little. Specifically, when the thickness TS18 of the silicon oxide film 32 on the gate electrode 18 of a memory cell is compared with the thickness TS21 of the silicon oxide film 32 on the gate electrode 21 of the transistor constituting the peripheral circuit, the relationship between TS18 and TS21 meets the following expression:

$$TS18 < TS21$$

For the silicon oxide film 32 to act as a mask in etching, the silicon oxide film 32 has to be thick enough to remain even after etching has been done. Specifically, if the thickness of the silicon oxide film 32 before etching is TS, the thickness of the WSi film 16 constituting the control gate is TCW, the thickness of the polysilicon film 15 is TCP, the etching rate of the WSi film 16 in etching the WSi film 16 and polysilicon film 15 with the silicon oxide film 32 as a mask is ACW, the etching rate of the polysilicon film 15 is ACP, the etching rate of the silicon oxide film 32 is AS1, the etching time of the ONO insulating film 14 is t, the etching rate of the silicon oxide film 32 at that time is AS2, the thickness of the polysilicon film 13 acting as a floating gate is TFP, the etching rate of the polysilicon film 13 is AFP, the etching rate of the silicon oxide film 32 at that time is AS3, the relationship between these factors will meet the following expression:

$$TS>[(TCW)/(ACW)+(TCP/ACP)]\times AS1+t\times AS2+(TFP/AFP)\times AS3$$

Etchants that can be used here are as follows. For example, $Cl_2+O_2$ can be used as an etchant for the WSi film 16, HBr for the polysilicon film 15, $CHF_3+CF_4+O_2$ for the ONO insulating film 14, and HBr for the polysilicon film 13.

Then, after the second resist 36 has been removed, a third resist 37 is formed. As shown in FIGS. 7A, 7B, and 7C, the third resist 37 is patterned so as to cover every other space between the gate electrodes 18 of memory cells and every other space between the word lines WL and expose every other space between the gate electrodes 18 of memory cells and every other space between the word lines WL. With the resist pattern as a mask, each gate insulating film 12 located between the gate electrodes 18 of adjacent memory cells and each field oxide film 23 located between the word lines WL are etched away to produce a common source region 24. For the etching conditions used in this case, a high selection ratio with respect to the silicon nitride film 31 is used with a view to allowing the silicon nitride film 31 to remain on the WSi film 16 after etching.

Specifically, if the thickness of the field oxide film 23 is TF, the etching rate of the field oxide film 23 is A, and the etching rate of the silicon nitride film 31 during the etching is B, the thickness TN of the silicon nitride film 31 will meet the following expression:

$$TN>(TF/A)\times B$$

As an etchant, for example, a mixed gas of $C_4F_8+CO+Ar$ is used.

In this way, the common source region 24 is formed using the silicon nitride film 31 as an etching stopper. When etching has been done under the above conditions, a recessed section 39 is formed at the silicon nitride film 31 and silicon oxide film 32 on the adjacent electrodes 18 on the side of the common source region 24 of the silicon oxide film 32. Similarly, a recession section 39 is formed at the silicon nitride film 31 and silicon oxide film 32 on the adjacent word lines WL on the side of the common source region 24. Specifically, when the thickness TNS of the silicon nitride film 31 formed on the gate electrode 18 on the common source region 24's side is compared with the thickness TND of the silicon nitride film 31 on the drain side (not shown), the relationship between TNS and TND meets the following expression:

$$TNS<TND$$

Figure 8A:
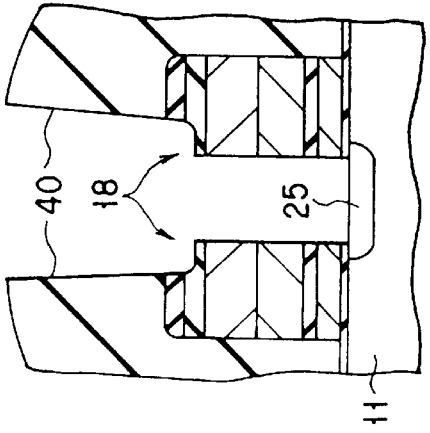
FIG. 8A is a sectional view to help explain the manufacturing step following that of FIG. 7A.
Figure 8B:
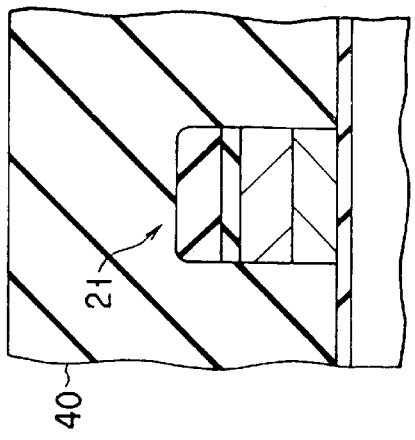
FIG. 8B is a sectional view to help explain the manufacturing step following that of FIG. 7B.
Figure 8C:
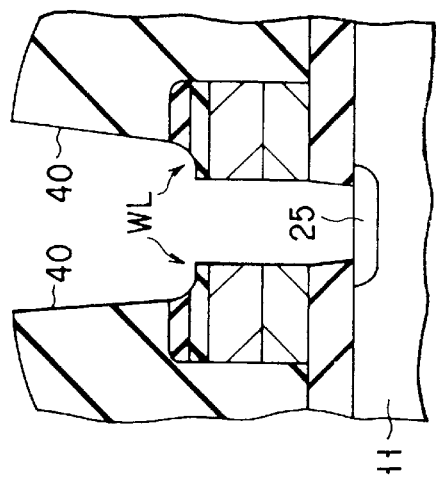
FIG. 8C is a sectional view to help explain the manufacturing step following that of FIG. 7C.

Thereafter, the third resist 37 is peeled and a fourth resist 40 is formed as shown in FIGS. 8A, 8B, and 8C. Specifically, the fourth resist 40 is patterned so as to cover every other space between the gate electrodes 18 of memory cells and every other space between the word lines WL and expose the common source regions 24. With the resist pattern as a mask, ions of n-type impurities, such as arsenic, are implanted into the semiconductor substrate 11 located between the gate electrodes 18 of memory cells and the semiconductor substrate 11 located between the word lines WL to produce common source lines 25.

Figure 9A:
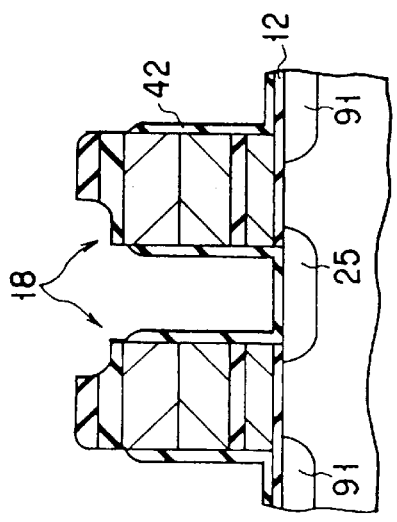
FIG. 9A is a sectional view to help explain the manufacturing step following that of FIG. 8A.
Figure 9B:
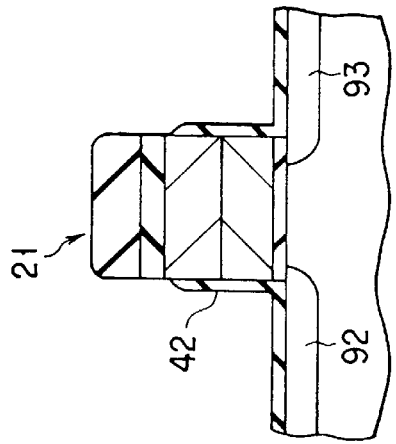
FIG. 9B is a sectional view to help explain the manufacturing step following that of FIG. 8B.
Figure 9C:
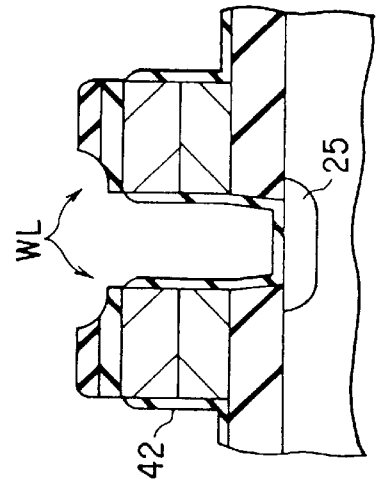
FIG. 9C is a sectional view to help explain the manufacturing step following that of FIG. 8C.

Then, as shown in FIGS. 9A, 9B, and 9C, after the fourth resist 40 has been removed, ions of n-type impurities, such as arsenic, are implanted into the drain region 91 of each memory cell and the source and drain regions 92, 93 of the transistor constituting the peripheral circuit with a resist pattern (not shown).

Figure 10A:
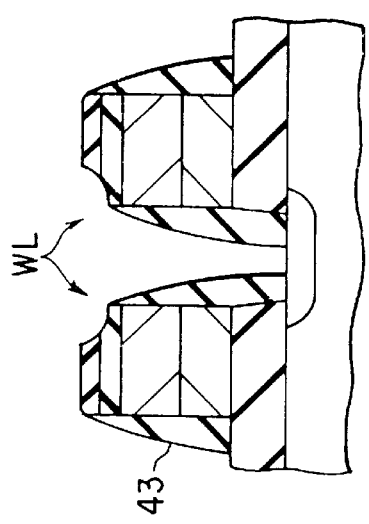
FIG. 10A is a sectional view to help explain the manufacturing step following that of FIG. 9A.
Figure 10B:
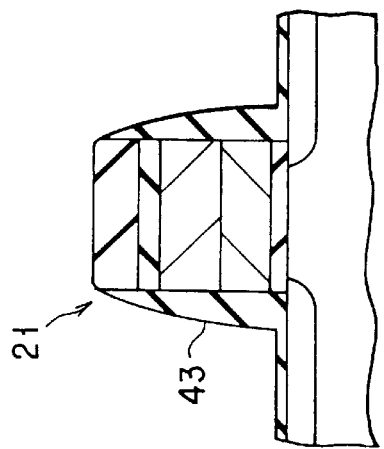
FIG. 10B is a sectional view to help explain the manufacturing step following that of FIG. 9B.
Figure 10C:
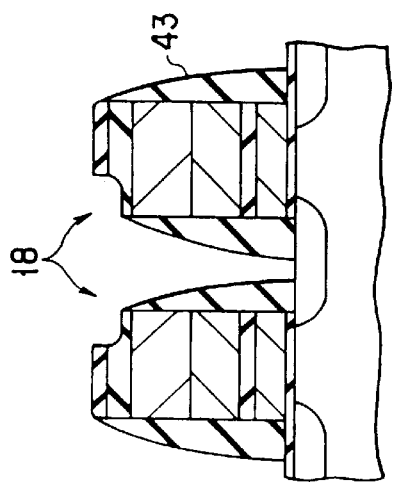
FIG. 10C is a sectional view to help explain the manufacturing step following that of FIG. 9C.
Figure 11A:
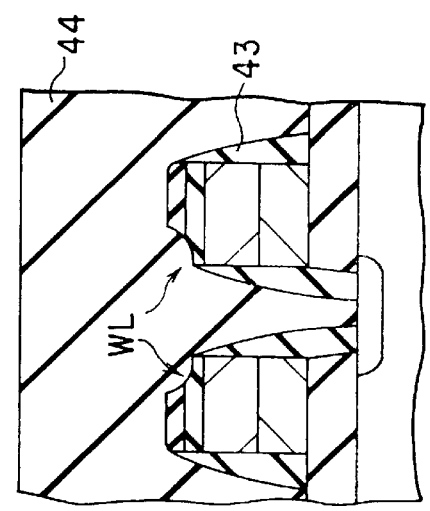
FIG. 11A is a sectional view to help explain the manufacturing step following that of FIG. 10A.
Figure 11B:
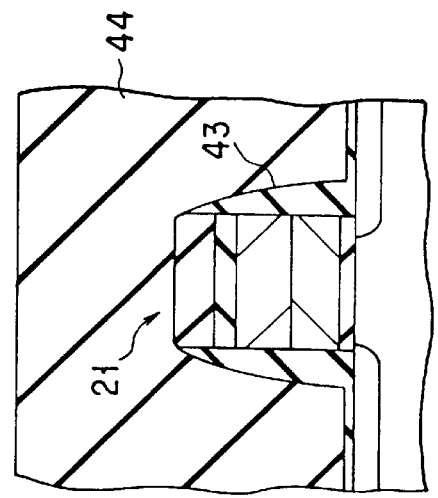
FIG. 11B is a sectional view to help explain the manufacturing step following that of FIG. 10B.
Figure 11C:
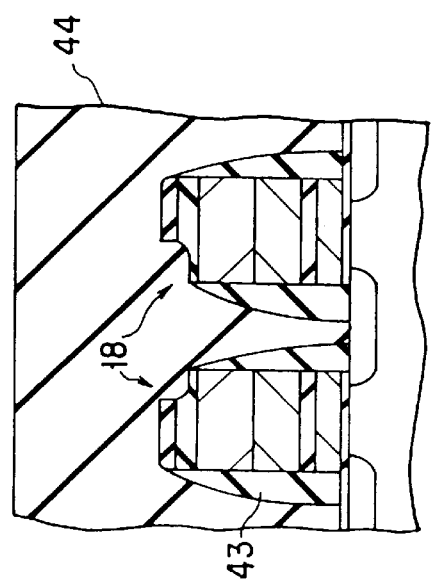
FIG. 11C is a sectional view to help explain the manufacturing step following that of FIG. 10C.
Figure 12A:
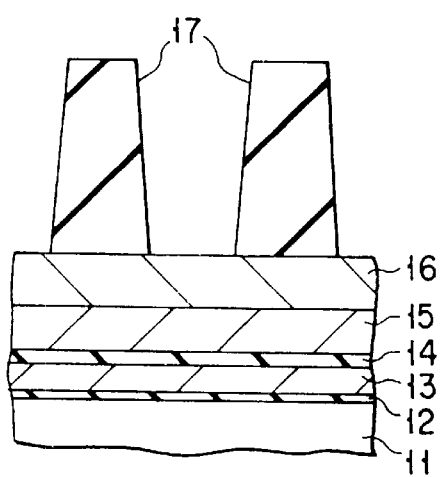
FIGS. 12A and 12B each show the process of manufacturing conventional nonvolatile semiconductor memory devices.
Figure 12B:
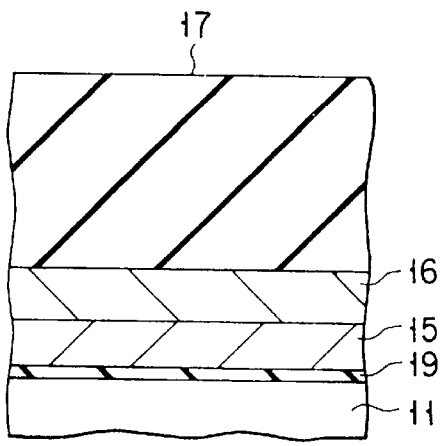
Figure 13A:
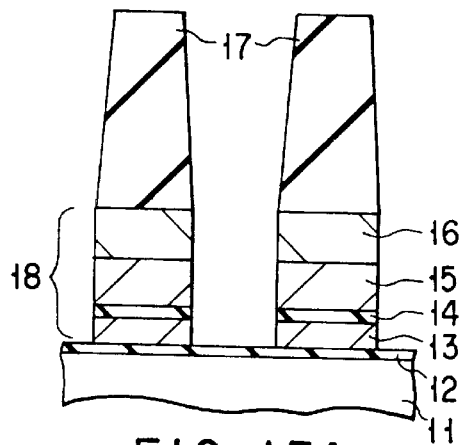
FIG. 13A is a sectional view to help explain the manufacturing step following that of FIG. 12A
Figure 13B:
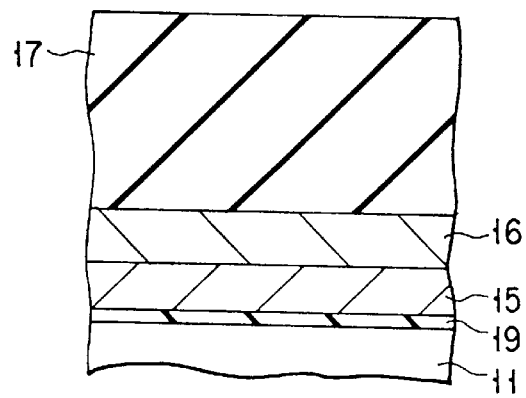
FIG. 13B is a sectional view to help explain the manufacturing step following that of FIG. 12B.
Figure 14A:
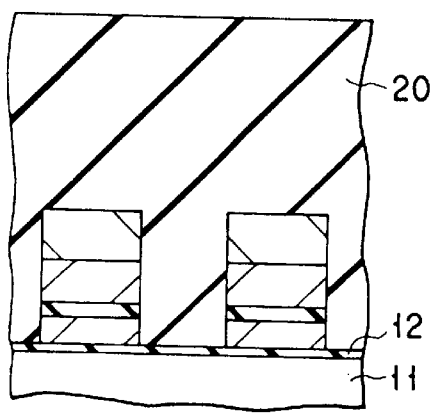
FIG. 14A is a sectional view to help explain the manufacturing step following that of FIG. 13A
Figure 14B:
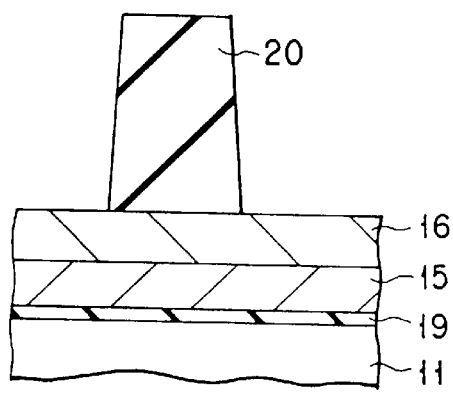
FIG. 14B is a sectional view to help explain the manufacturing step following that of FIG. 13B.
Figure 17A:
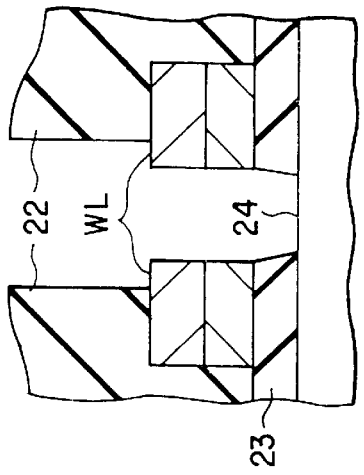
FIG. 17A is a sectional view to help explain the manufacturing step following that of FIG. 16A.
Figure 17B:
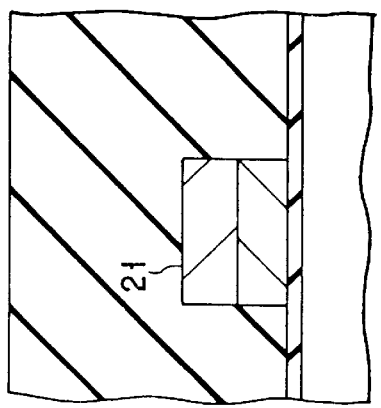
FIG. 17B is a sectional view to help explain the manufacturing step following that of FIG. 16B.
Figure 17C:
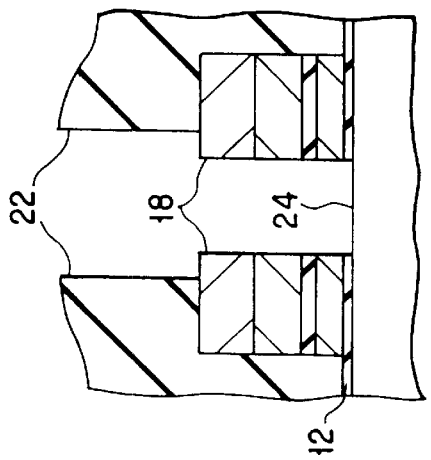
FIG. 17C is a sectional view to help explain the manufacturing step following that of FIG. 16C.
Figure 18A:
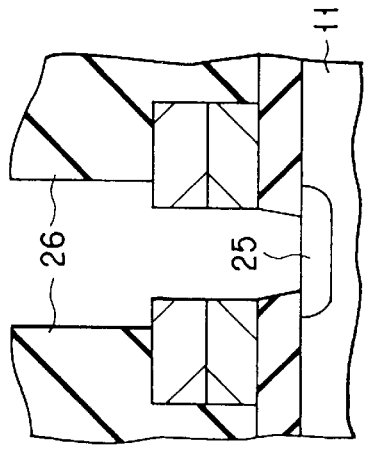
FIG. 18A is a sectional view to help explain the manufacturing step following that of FIG. 17A.
Figure 18B:
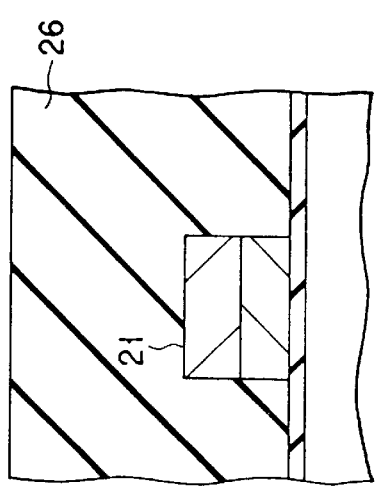
FIG. 18B is a sectional view to help explain the manufacturing step following that of FIG. 17B.
Figure 18C:
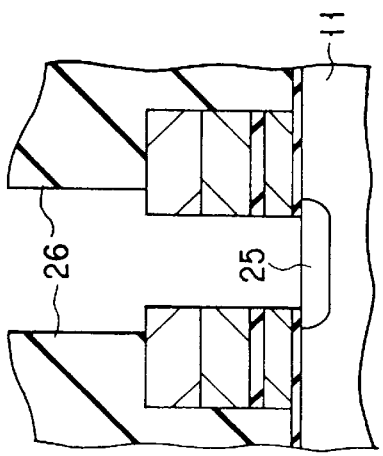
FIG. 18C is a sectional view to help explain the manufacturing step following that of FIG. 17C.

Thereafter, as shown in FIGS. 9A, 9B, and 9C, an oxide film 42 is formed on the side faces of the gate electrodes 18, 21 and the side faces of the word lines WL, on the gate insulating film 12, and on the common source lines 25. Then, as shown in FIGS. 10A, 10B, and 10C, sidewalls 43 made of $SiO_2$ are formed on the side faces of the gate electrodes 18, 21 and the side faces of the word lines WL. Thereafter, an interlayer insulating film 44 made of, for example, BPSG is formed all over the surface as shown in FIGS. 11A, 11B, and 11C.

With the embodiment, the lithographic process of effecting patterning to form the control gates CG of memory cells and that of effecting patterning to form the gate electrode 21 of the transistor constituting the peripheral circuit section are carried out in a single session. This reduces the number of lithographic processes that require accurate dimension control, which simplifies the manufacturing processes.

Furthermore, in a single session of lithography, a mask composed of the silicon nitride film 31 and silicon oxide film 32 is formed on the WSi film 16 constituting the control gates CG and the mask composed of the silicon nitride film 31 and silicon oxide film 32 is used to etch the ONO film 14 and polysilicon film 13 to produce the floating gates FG. As a result, the floating gate can be produced more easily than when a resist with a high aspect ratio is used as a mask. The manufacturing method can be applied to the case where the distance between the gate electrodes of memory cells conforming to the minimum dimensions of the design rules is still smaller. This feature is advantageous to the manufacture of semiconductor memory devices.

Furthermore, the silicon nitride film 31 acts as an etching stopper when the gate insulating film 12 and field oxide film 23 are etched to form a common source region. As a result, the WSi film 16 is prevented from being exposed during the etching.

When ions are implanted into the common source region, the WSi film 16 is covered with the silicon nitride film 31 acting as an etching stopper. This keeps high-concentration impurities from being introduced into the WSi film 16, which prevents abnormal oxidation from occurring in a subsequent oxidation process.

While in the embodiment, the 1500 Å silicon nitride film 31 and the 3000 Å silicon oxide film 32 are used, the film thickness is not limited to these values. The film thickness has only to be determined in the range where they remain after they have been used as masks in etching and their aspect ratio is not higher than necessary in the form of the pattern during the etching. For example, the thickness of the silicon nitride film is in the range of 500 to 1500 Å and the thickness of the silicon oxide film is in the range of 2000 to 3000 Å. Specifically, the thickness of the silicon oxide film 32 has only to be thick enough to remain after the WSi film 16 acting as a control gate, polysilicon film 15, ONO insulating film 14, and polysilicon film acting as a floating gate have been etched away. When the WSi film 16, polysilicon film 15, ONO insulating film 14, and polysilicon film 13 are etched with a high selection ratio with respect to the silicon oxide film 32 acting as a mask, the silicon oxide film 32 can be made thinner than the above-described film thickness.

Furthermore, the thickness of the silicon nitride film 31 has only to be thick enough to prevent the WSi film 16 from being exposed when the common source region is formed. Therefore, use of a high selection ratio with respect to the silicon nitride film 31 enables the thickness of the silicon nitride film 31 to be smaller than the above-described film thickness.

A second embodiment of the present invention will be described. In the first embodiment, the silicon nitride film 31 is formed directly on the WSi film 16 constituting the control gate.

Figure 19A:
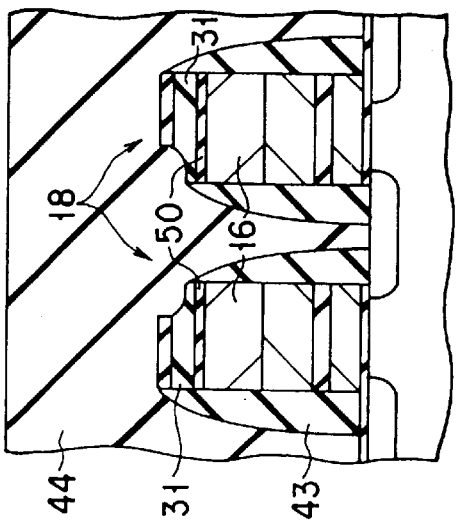
FIGS. 19A, 19B, and 19C show a second embodiment according to the present invention.
Figure 19B:
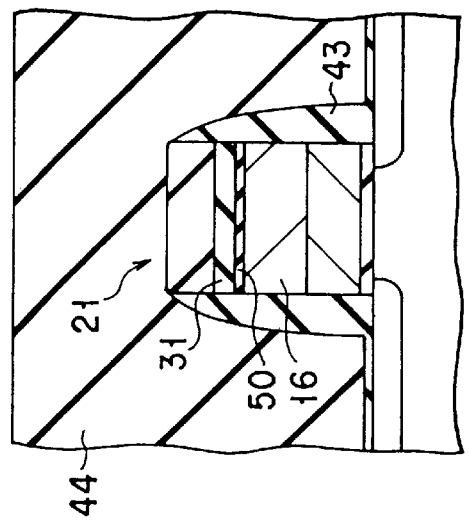
Figure 19C:
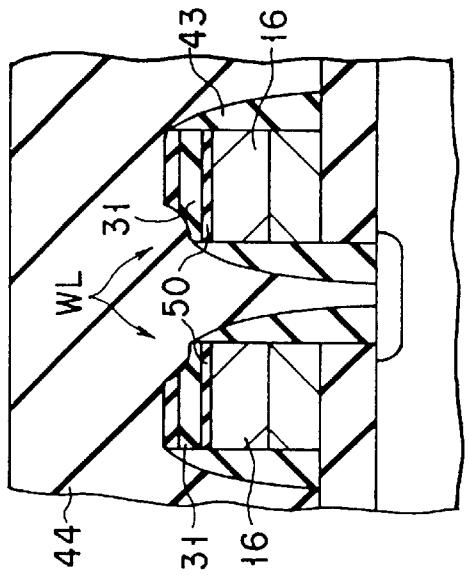

In contrast, in the second embodiment, a silicon oxide film 50 is formed between the WSi film 16 and the silicon nitride film 31 as shown in FIG. 19. This configuration prevents hydrogen from diffusing from the silicon nitride film 31 to the WSi film 16. It is desirable that the thickness of the silicon oxide film 50 provided for the purpose should be for example, more than 50 nm and less than 100 nm.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

I claim:

1. A method of manufacturing nonvolatile semiconductor memory device, comprising steps of:

forming a gate insulating film on a semiconductor substrate;

forming a first polysilicon layer on a part of said gate insulating film so as to make a first gate electrode of a two-layer gate-electrode memory cell;

forming an insulating film on the first polysilicon layer;

forming a second polysilicon layer and a metallic silicide layer in order on said insulating film and said gate insulating film so as to make a second gate electrode of said two-layer gate-electrode memory cell and a gate electrode of a transistor constituting part of a peripheral circuit;

depositing a silicon nitride film and a silicon oxide film in that order above said metallic silicide layer;

forming a resist pattern on said silicon oxide film, said resist pattern selectively covering a region where said second gate electrode and the gate electrode of said transistor are to be formed;

etching said silicon oxide film and silicon nitride film with said resist pattern as a mask;

etching said metallic silicide layer and second polysilicon layer with said silicon oxide film and silicon nitride film remaining above said metallic silicide layer as a mask to form said second gate electrode and the gate electrode of said transistor;

etching said insulating film and first polysilicon layer with said silicon oxide film and silicon nitride film remaining above said second gate electrode as a mask to form said first gate electrode;

etching said gate insulating film on said semiconductor substrate with said silicon oxide film and silicon nitride film remaining above said second gate electrode as a mask to form a first source region; and introducing impurities into said source region with said silicon oxide film and silicon nitride film remaining above said second gate electrode as a mask to form a source line.

2. A method according to claim 1, further comprising the step of forming said second polysilicon layer, metallic silicide layer, silicon nitride film, and silicon oxide film above a field oxide film and etching the second polysilicon layer, metallic silicide layer, silicon nitride film, and silicon oxide film to form said second gate electrode and a word line on the field oxide film at the same time.

3. A method according to claim 2, further comprising the step of etching said field oxide film with said silicon nitride film as an etching stopper to form a second source region which is connected to the first source region, the source regions being self-aligned with said word line.

4. A method according to claim 3, wherein said silicon nitride film is thick enough to remain after said field oxide film has been etched.

5. A method according to claim 4, wherein the thickness TN of said silicon nitride film will meet the following expression, if the thickness of the field oxide film in TF, the etching rate of the field oxide film is A and the etching rate of the silicon nitride film is B during etching the field oxide film:

$$TN > (TF/A) \times B.$$

6. A method according to claim 5, wherein the thickness of said silicon nitride film is in the range of 500 to 1500 Å.

7. A method according to claim 1, wherein said silicon oxide film is thick enough to remain after etching has been done to form said first and second gate electrodes.

8. A method according to claim 7, wherein if the thickness of said silicon oxide film is TS, the thickness of the metallic silicide film is TCW, the thickness of said second polysilicon film is TCP; the etching rate of said metallic silicide film is ACW, the etching rate of said second polysilicon film is ACP, and the etching rate of said silicon oxide film is AS1 in etching said metallic silicide film and said second polysilicon film with said silicon oxide film as a mask; the etching time of the insulating film on said first polysilicon layer is t, the etching rate of said silicon oxide film at that time is AS2; the thickness of said first polysilicon film is TFP; the etching rate of said first polysilicon film is AFP, and the etching rate of said silicon oxide film at that time is AS3; the relationship between these factors will meet the following expression:

$$TS > [(TCW)/(ACW) + (TCP/ACP)] \times AS1 + t \times AS2 + (TFP/AFP) \times AS3.$$

9. A method according to claim 8, wherein the thickness of said silicon oxide film is in the range of 2000 to 3000 Å.

10. A method according to claim 1, further comprising the step of oxidizing said first and second gate electrodes, and said gate electrode of said transistor to form an oxide film on the sidewalls of these elements.

11. A method according to claim 1, further comprising the step of forming a silicon oxide film between said metallic silicide layer and said silicon nitride film.

12. A method according to claim 11, wherein the thickness of said silicon oxide film is in the range of 50 nm to 100 nm.

13. A method of manufacturing nonvolatile semiconductor memory device, comprising steps of:

forming a field oxide film and a gate insulating film on a semiconductor substrate;

forming a first polysilicon layer on a part of said gate insulating film so as to make a first gate electrode of a two-layer gate-electrode memory cell, forming an insulating film on the first polysilicon layer, and forming a second polysilicon layer and a metallic silicide layer in that order on said insulating film, said gate insulating film, and said field oxide film, said second polysilicon layer and metallic silicide layer being formed so as to make a second gate electrode of the two-layer gate-electrode memory cell, a gate electrode of a transistor constituting part of a peripheral circuit, and a word line;

depositing a silicon nitride film and a silicon oxide film above said metallic silicide layer;

forming a resist pattern on said silicon oxide film, said resist patter selectively covers a region where said second gate electrode, the gate electrode of said transistor, and said word line are to be formed;

etching said silicon oxide film and silicon nitride film with said resist pattern as a mask;

etching said metallic silicide layer and second polysilicon layer with said silicon oxide film and silicon nitride film remaining above said metallic silicide layer as a mask to form said second gate electrode, the gate electrode of said transistor, and said word line at the same time;

etching said insulating film and first polysilicon layer with said silicon oxide film and silicon nitride film remaining above said second gate electrode as a mask to form said first gate electrode;

etching the gate insulating film on said semi-conductor substrate with said silicon oxide film and silicon nitride film remaining above said second gate electrode as a mask to form a first source region; and introducing impurities into said first source region with said silicon oxide film and silicon nitride film remaining above said second gate electrode as a mask to form a source line.

14. A method according to claim 13, further comprising the step of etching said field oxide film with said silicon nitride film as an etching stopper to form a second source region which is connected to the first source region, the source regions being self-aligned with said word line.

15. A method according to claim 14, wherein said silicon nitride film is thick enough to remain after said field oxide film has been etched.

16. A method according to claim 15, wherein the thickness TN of said silicon nitride film will meet the following expression, if the thickness of the field oxide film is TF, the etching rate of the field oxide film is A and the etching rate of the silicon nitride film is B during etching the field oxide film:

$$TN > (TF/A) \times B.$$

17. A method according to claim 16, wherein the thickness of said silicon nitride film is in the range of 500 to 1500 Å.

18. A method according to claim 13, wherein said silicon oxide film is thick enough to remain after etching has been done to form said first and second gate electrodes.

19. A method according to claim 18, wherein if the thickness of said silicon oxide film is TS, the thickness of the metallic silicide film is TCW, the thickness of said second polysilicon film is TCP; the etching rate of said metallic silicide film is ACW, the etching rate of said second polysilicon film is ACP, and the etching rate of said silicon oxide film is AS1 in etching said metallic silicide film and said second polysilicon film with said silicon oxide film as a mask; the etching time of the insulating film on said first polysilicon layer is t, the etching rate of said silicon oxide film at that time is AS2; the thickness of said first polysilicon film is TFP; the etching rate of said first polysilicon film is AFP, and the etching rate of said silicon oxide film at that time is AS3; the relationship between these factors will meet the following expression:

$$TS > [(TCW)/(ACW) + (TCP/ACP)] \times AS1 + t \times AS2 + (TFP/AFP) \times AS3.$$

20. A method according to claim 19, wherein the thickness of said silicon oxide film is in the range of 2000 to 3000 Å.

21. A method according to claim 13, further comprising the step of oxidizing said first and second gate electrodes, said gate electrode of said transistor, and said word line to form an oxide film on the sidewalls of these elements.

22. A method according to claim 13, further comprising the step of forming a silicon oxide film between said metallic silicide layer and said silicon nitride film.

23. A method according to claim 22, wherein the thickness of said silicon oxide film is in the range of 50 nm to 100 nm.

* * * * *

UNITED STATES PATENT AND TRADEMARK OFFICE
CERTIFICATE OF CORRECTION

PATENT NO.: 5,989,959
DATED: November 23, 1999
INVENTOR(S): Yoshiko ARAKI

It is certified that an error appears in the above-identified patent and that said Letters Patent is hereby corrected as shown below:

In Claim 13, column 11, line 9, replace "patter" with --pattern--.

Signed and Sealed this

Eighteenth Day of July, 2000

Attest:

Q. TODD DICKINSON

*Attesting Officer*     *Director of Patents and Trademarks*